United States Patent [19]
Lee

[11] Patent Number: 5,864,501
[45] Date of Patent: Jan. 26, 1999

[54] TEST PATTERN STRUCTURE FOR ENDURANCE TEST OF A FLASH MEMORY DEVICE

[75] Inventor: Hee Youl Lee, Daegu, Rep. of Korea

[73] Assignee: Hyundai Electronics Industries Co., Ltd., Kyungki, Rep. of Korea

[21] Appl. No.: 963,980

[22] Filed: Nov. 4, 1997

[30] Foreign Application Priority Data

Nov. 4, 1996 [KR] Rep. of Korea ...................... 96-51775

[51] Int. Cl.$^6$ .................................................. G11C 29/00
[52] U.S. Cl. ............................... 365/185.09; 365/185.33; 365/185.1; 257/316; 257/319; 257/321; 257/48
[58] Field of Search .................................... 257/316, 319, 257/321, 48; 365/185.33, 185.09, 185.1

[56] References Cited

U.S. PATENT DOCUMENTS 5,255,219 10/1993 Sakai .................................... 365/185.32
5,615,150 3/1997 Lin et al. ............................. 365/185.17

*Primary Examiner*—David C. Nelms
*Assistant Examiner*—Andrew Q. Tran
*Attorney, Agent, or Firm*—Scott C. Harris, Esq.

[57] ABSTRACT

This invention relates to a test pattern structure comprising a test pattern structure for endurance test of a flash memory device comprising: at least three active regions formed on a semiconductor substrate, each active region being isolated by a field oxide film; a common drain region formed on each active region, respectively; source regions formed on left and right sides of the common drain region in each active region, respectively; a first common floating gate formed along left side of each common drain region; a second common floating gate formed along right side of each common drain region; a control gate overlapped with the first and second floating gates, respectively and connected from each other at both ends of the first and second floating gates; a select gate formed over the common drain region, the source regions and the control gate in each active region, respectively; and metal wires connected to the common drain region, the source regions and the control gate in each active region, respectively.

4 Claims, 3 Drawing Sheets

TEST PATTERN STRUCTURE FOR ENDURANCE TEST OF A FLASH MEMORY DEVICE

BACKGROUND OF THE INVENTION

1. Field of the Invention

This invention relates to a test pattern structure for endurance test of a flash memory device. In particular, it relates to a test pattern structure that can confirm which function of program, erasure or read is related to degradation of characteristics of the flash memory device.

2. Description of the Related Art

A flash memory device such as a flash EEPROM has both functions of program and erasure. The flash EEPROM must maintain its characteristics although both functions of program and erasure are repeatedly performed. However, as program and erasure operations are performed many times, the characteristics of the flash EEPROM is degraded. Hence, to improve endurance reliability, it is required to find the reason for degradation of characteristics of the flash EEPROM.

In the prior art, to confirm cycling endurance characteristics of program and erasure functions, program and erasure operations are repeatedly performed using a test pattern having a same construct as a pattern of a main chip cell. Since such a test pattern can only confirm the degradation of characteristics of the flash EEPROM, there is disadvantage in that it can not confirm which function of program, erasure or read is related to degradation of characteristics of the flash EEPROM.

SUMMARY OF THE INVENTION

Therefore, it is an object to provide a test pattern structure that can confirm which function of program, erasure or read is related to degradation of characteristics of the flash EEPROM.

The test pattern structure of the present invention comprises at least three active regions defined on a semiconductor substrate, each active region being isolated from each other by a field oxide film; a common drain region formed on each active region, respectively; source regions formed on left and right sides of the common drain region in each active region, respectively; a first common floating gate formed along left side of each common drain region; a second common floating gate formed along right side of each common drain region; a control gate overlapped with the first and second floating gates, respectively and connected to each other at both ends of the first and second floating gates; a select gate formed over the common drain region, the source regions and said control gate in each active region, respectively; and metal wires connected to the common drain region, the source regions and said control gate in each active region, respectively.

BRIEF DESCRIPTION OF THE DRAWINGS

For fuller understanding of the nature and objects of the present invention, reference should be had to the following detailed description taken in conjunction with the accompanying drawings in which.

DETAILED DESCRIPTION OF THE INVENTION

Figure 1:
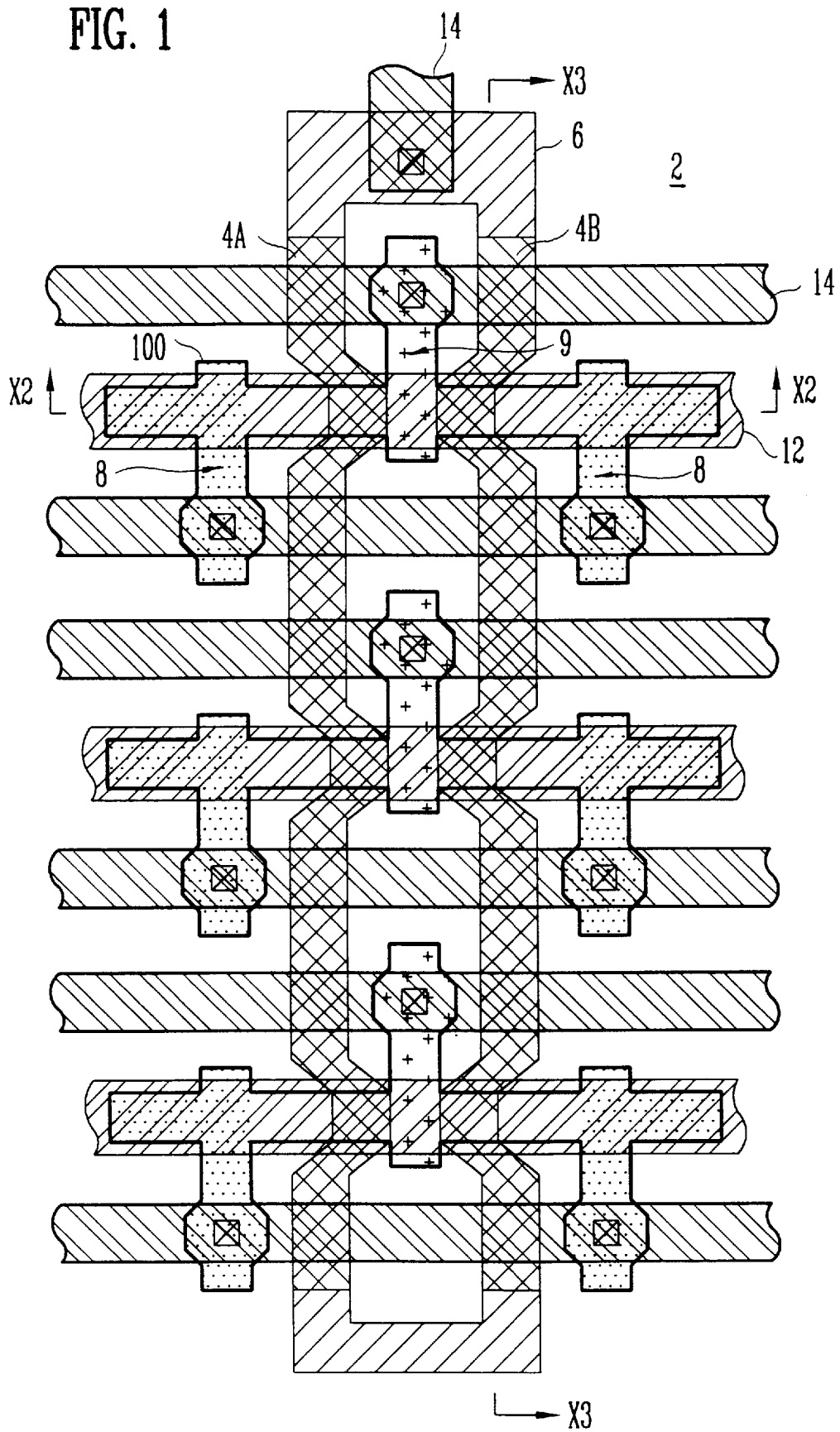
FIG. 1 is a lay-out to illustrate a test pattern for endurance test of a flash EEPROM according to the present invention.
Figure 2:
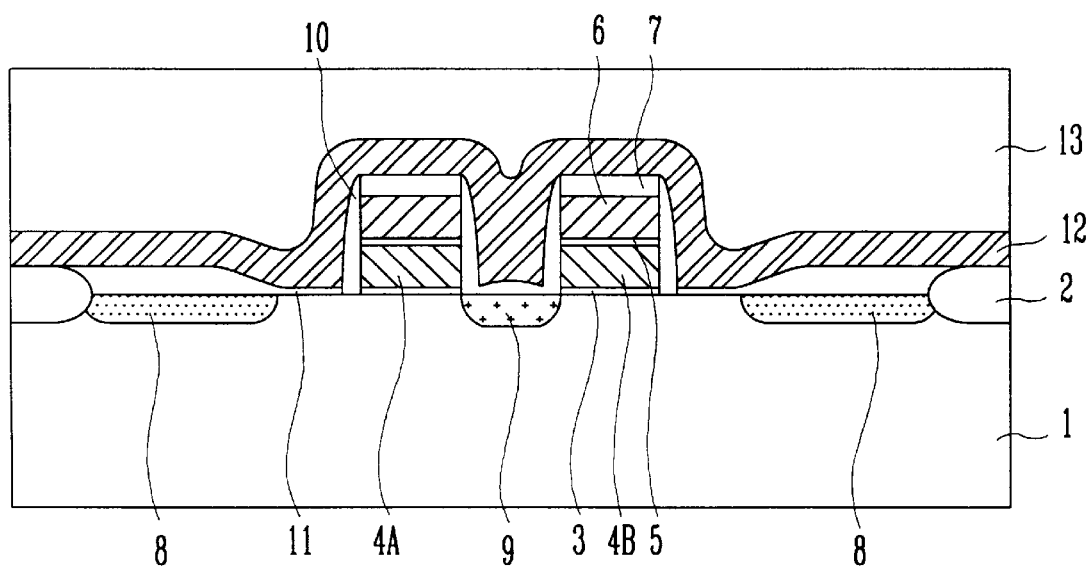
FIG. 2 is a cross-sectional view taken along the line X2—X2 of FIG. 1.
Figure 3:
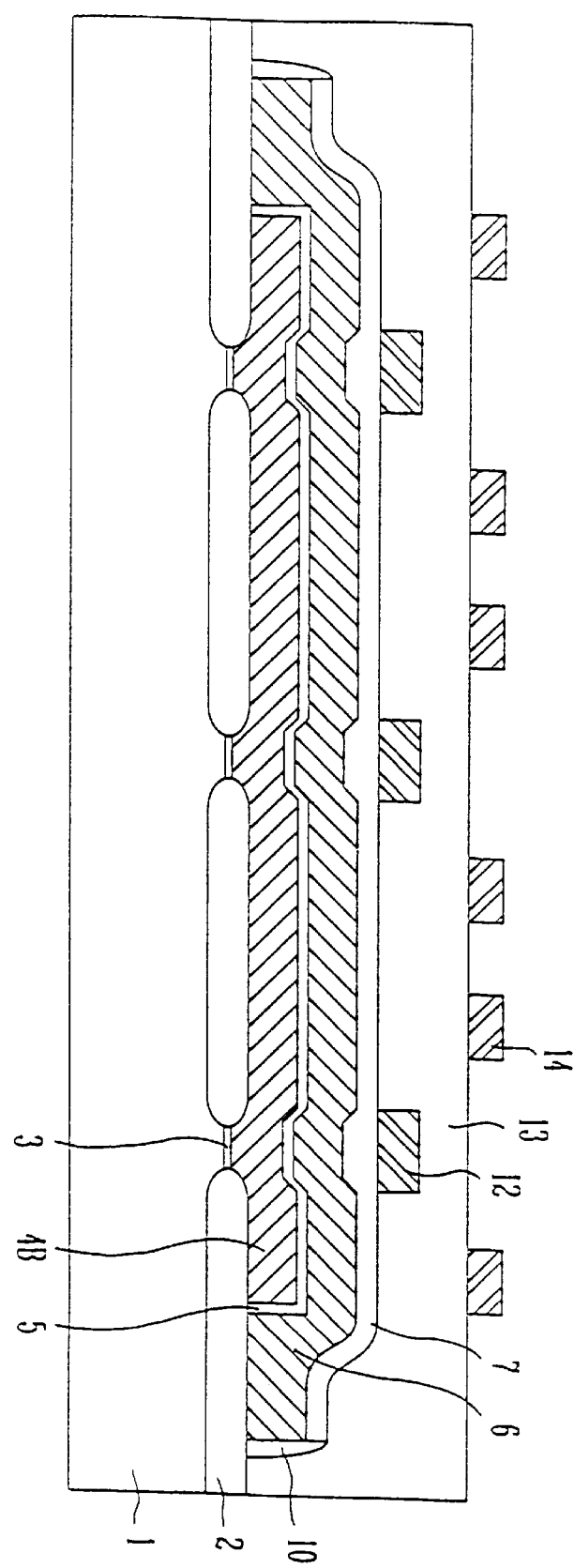
FIG. 3 is a cross-sectional view taken along the line X3—X3 of FIG. 1.

FIG. 1 is a lay-out to illustrate a test pattern for endurance test of a flash EEPROM according to the present invention, FIG. 2 is a cross-sectional view taken along the line X2—X2 of FIG. 1 and FIG. 3 is a cross-sectional view taken along the line X3—X3 of FIG. 1. The test pattern of the present invention will be explained with reference to FIGS. 1, 2 and 3.

A field oxide film 2 is formed on a semiconductor substrate 1, at least three(3) active regions 100 are defined by the field oxide film 2. Two cells including a drain region 9 in common are fomed on each active region 100, wherein the drain region 9 is formed between the two cells. A first common floating gate 4A is formed so that the first floating gate 4A is used in common to left cells positioned at left side of each common drain region 9 in each active region 100.

A second common floating gate 4B is formed so that the second common floating gate 4B is used in common to right cells positioned at the right side of each drain region 9 in each active region 100.

In each active region 100, the first and second common flating gates 4A and 4B are electrically isolated from the semiconductor substrate 1 by a tunnel oxide layer 3, respectively.

A control gate 6 is overlapped with each common floating gates 4A and 4B to form stack transistor pattern in each active region 100 and connected from each other at both ends of the first and second floating gates 4A and 4B to use in common entire cells. Two stack transistor patterns are formed at each active region 100. The contral gate 6 is electrically isolated from the first and second common floating gate 4A and 4B by a dielectric layer 5, respectively.

A source region 8 is formed in a portion of the semiconductor substrate being constantly spaced in direction of out side from the stack transistor pattern, respectively, while the common drain region 9 is formed in a portion of the semiconductor substrate between two stack transistor patterns.

A select gate 12 is formed over two stack transistor patterns, two source regions 8 and the common drain region 9 in each acive region 100, respectively. The select gate 12 is electrically isolated from the stack transistor patterns by an insulating layer 7 formed on the stack transistor patterns and an insulating spacer 10 formed on side wall thereof. In addition, the select gate 12 is electrically isolated from the source regions 8 and the common drain region 9 by an oxide layer which is formed during the formation of a select gate oxide layer 11. The select gate oxide layer 11 is formed on the semiconductor substrate 1 between the stack transistor pattern and the source region 8.

An inter-insulating layer 13 is formed on entire structure including the select gate 12 and metal wire 14 is formed to connect the source region 8, the common drain region 9 and control gate 6, respectively.

A test pattern of the present invention has active regions isolated from each other, the test pattern being different from a main cell of the flash EEPROM. Source contacts in the cell are individually formed and drain contacts are also individually formed. A first common floating gate is used in common to a left cell of each active region and a second common floating gate is used in common to a right cell of each active region. Program, erasure or read operation of each cell can be individually performed in response to a word line select signal. Therefore, it is possible to confirm which function of program, erasure and read is related to degradation of characteristics of the flash EEPROM, thereby improving endurance reliability of the flash EEPROM.

Many modifications and variations may be made in the techniques and structures described and illustrated herein without departing from the spirit and scope of the present invention. Accordingly, it should be understood that the techniques and structures described and illustrated herein are illustrative only and are not to be considered as limitations upon the scope and spirit of the present invention.

What is claimed is:

1. A test pattern structure for endurance test of a flash memory device comprising:

at least three active regions defined on a semiconductor substrate, each active region being isolated from each other by a field oxide film;

a common drain region formed on each active region, respectively;

source regions formed on left and right sides of said common drain region in each active region, respectively;

a first common floating gate formed along left side of each common drain region;

a second common floating gate formed along right side of each common drain region;

a control gate overlapped said first and second floating gates, respectively and connected to each other at both ends of said first and second floating gates;

a select gate formed over said common drain region, said source regions and said control gate in each active region, respectively; and metal wires connected to said common drain region, said source regions and said control gate in each active region, respectively.

2. The test pattern structure of claim 1, further comprising a tunnel oxide layer to electrically isolate said first and second floating gates from said semiconductor substrate.

3. The test pattern structure of claim 1, further comprising a dielectric layer to electrically isolate said control gate from said first and second common floating gates.

4. The test pattern structure of claim 1, further comprising an insulating layer to electrically isolate said common drain region, said source regions, said first and second common floating gates, said control gate, respectively.

* * * * *